ary Examiner—James R. Hoffman

United States Patent [19]
Hochberg

[11] 4,220,116
[45] Sep. 2, 1980

[54] REACTANT GAS FLOW STRUCTURE FOR A LOW PRESSURE CHEMICAL VAPOR DEPOSITION SYSTEM

[75] Inventor: Arthur K. Hochberg, San Diego, Calif.

[73] Assignee: Burroughs Corporation, Detroit, Mich.

[21] Appl. No.: 955,653

[22] Filed: Oct. 30, 1978

[51] Int. Cl.³ .................... C23C 11/00; C23C 13/08
[52] U.S. Cl. .................................. 118/715; 118/728
[58] Field of Search ............................... 118/715, 728

[56] References Cited
U.S. PATENT DOCUMENTS

| | | | |
|---|---|---|---|
| 3,753,809 | 8/1973 | Gaier et al. | 148/189 |
| 3,922,467 | 11/1975 | Pinchon | 118/728 X |
| 4,018,183 | 4/1977 | Meuleman | 118/715 |
| 4,062,318 | 12/1977 | Ban et al. | 118/725 |

Primary Examiner—James R. Hoffman
Attorney, Agent, or Firm—Charles J. Fassbender; Mervyn L. Young; Kevin R. Peterson

[57] ABSTRACT

A structure for a low-pressure chemical vapor deposition system which achieves greater uniformity of deposition. The structure includes injection means designed to provide more uniform distribution of the reactant gases injected into the system, as well as means to control the gas flow across the surfaces of the respective wafers and then the exhaust of those gases from the system. To this end, plenums which run the length of the deposition chamber beneath or to the side of the wafers are provided with openings arranged in a non-uniform manner to achieve this uniform injection. Furthermore, the wafer support or boat is provided with means to disperse concentrations of the reactant gases so as to provide more uniformity of the gas flow across the surfaces of the wafers.

12 Claims, 6 Drawing Figures

U.S. Patent  Sep. 2, 1980  Sheet 1 of 2  4,220,116
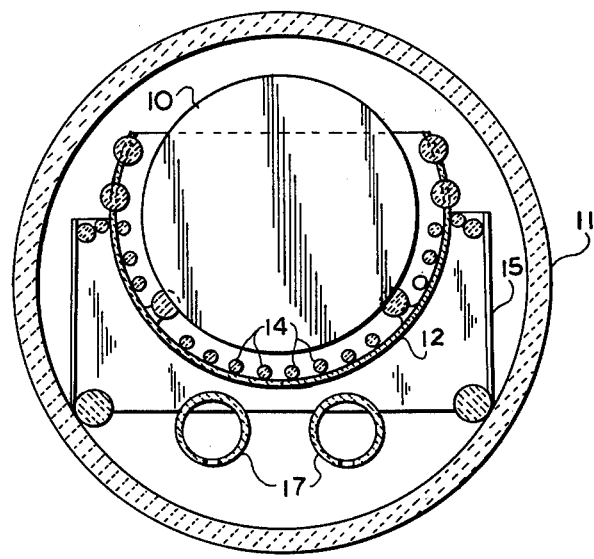
FIG. 1
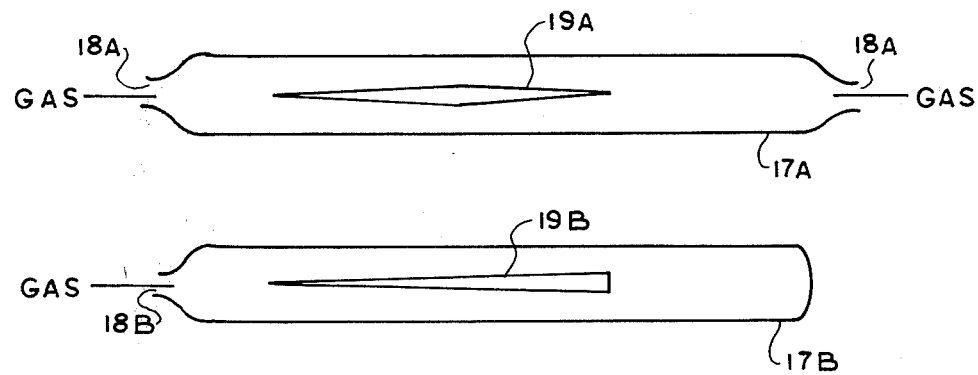
FIG. 2A
FIG. 2B
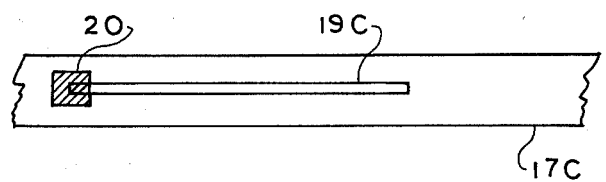
FIG. 2C

REACTANT GAS FLOW STRUCTURE FOR A LOW PRESSURE CHEMICAL VAPOR DEPOSITION SYSTEM

BACKGROUND OF THE INVENTION

1. Field of the Invention

The present invention relates to a low pressure chemical vapor deposition system for the fabrication of integrated circuits. More particularly, the present invention relates to such a system for the deposition of polysilicon layers as well as the growth of oxide and other passivating layers and also epitaxial crystalline layers.

2. Description of the Prior Art

Many prior art chemical vapor deposition systems operate at or near atmospheric pressures to avoid the necessity of high vacuum pumps and related problems. However, such systems require the use of large volumes of carrier gases or inert gases such as hydrogen which dilute the reactant gases so as to prevent predeposition except at the heated wafer surface on which the integrated circuits are to be formed. In addition, such atmospheric pressure systems contain atmosphere contaminants (from back diffusion) that may also be deposited on the wafer surface. As distinct therefrom, low pressure systems or high vacuum systems do not require such carrier gases or at least only a minimal amount of such gases so that generally pure reactant gases can be introduced and the flow characteristics of such gases are easily controllable so as to obtain more uniform depositions and dopant distributions in the films being deposited. Furthermore, with the flow characteristics of sub-atmospheric pressure, it is possible to load the system with hundreds of wafers at a time as distinct from only three to ten (three inch) wafers as is possible for certain processes at, or close to, atmospheric pressure.

Another way of more closely controlling uniformity of the deposition and doping of the wafers is the design of the tray or boat which holds the wafers so as to disperse the reactant gases in a more uniform manner. Various types of prior art designs are disclosed in, for example, the Gaier, et al., U.S. Pat. No. 3,753,809 and the Meuleman U.S. Pat. No. 4,018,183. Still another method of insuring more uniform flow of the reactant gases is to control the entrance of those gases into the system chamber such as by a pipe or plenum which runs the length of the chamber and ejects the gases across the surface of the wafers in a more uniform manner. A particular example of such an apparatus is disclosed in the Ban, et al., U.S. Pat. No. 4,062,318.

The above described Gaier, et al., and Meuleman patents are not directed specifically toward low pressure chemical vapor deposition systems. If employed in such a low pressure or high vacuum embodiment, the reactant gases would tend to react prior to contact with the wafer's surfaces. This is true also with the Ban, et al., structure of a single pipe or plenum for the furnishing of reactant gases to the vicinity of the wafers.

It is then an object of the present invention to provide an improved low pressure chemical vapor deposition system.

It is another object of the present invention to provide an improved support mechanism for the wafers in a low pressure chemical vapor deposition system.

It is still another object of the present invention to provide an improved reactant gas injection system for employment in a low pressure and chemical vapor deposition system.

SUMMARY OF THE INVENTION

In order to achieve the above identified objects, a structure for a low pressure chemical vapor deposition system is provided which includes injection means designed to provide more uniform distribution of the reactant gases injected into the system, as well as means to control the gas flow across the surfaces of the respective wafers and then the exhaust of those gases from the system.

One feature, then, of the present invention resides in plenums which run the length of the deposition chamber beneath or to the side of the wafer which are provided with openings arranged in a non-uniform manner to achieve uniform injection.

Another feature of the present invention resides in a wafer support or boat which is provided with means to disperse concentrations of the reactant gases so as to provide more uniformity of the gas flow across the surface of the wafers. In addition, the structure provides for optimum exhaust of the reactant gases once they have crossed the surfaces.

BRIEF DESCRIPTION OF THE DRAWINGS

The above and other identified objects, advantages and features of the present invention will become more readily apparent from a review of the following specification when taken in conjunction with the drawings wherein:

FIG. 1 is a cross-sectional view illustrating the features of the present invention;

FIG. 2A–C are plan views of different embodiments of a plenum as employed in the present invention;

GENERAL DESCRIPTION OF THE INVENTION

Figure 3:
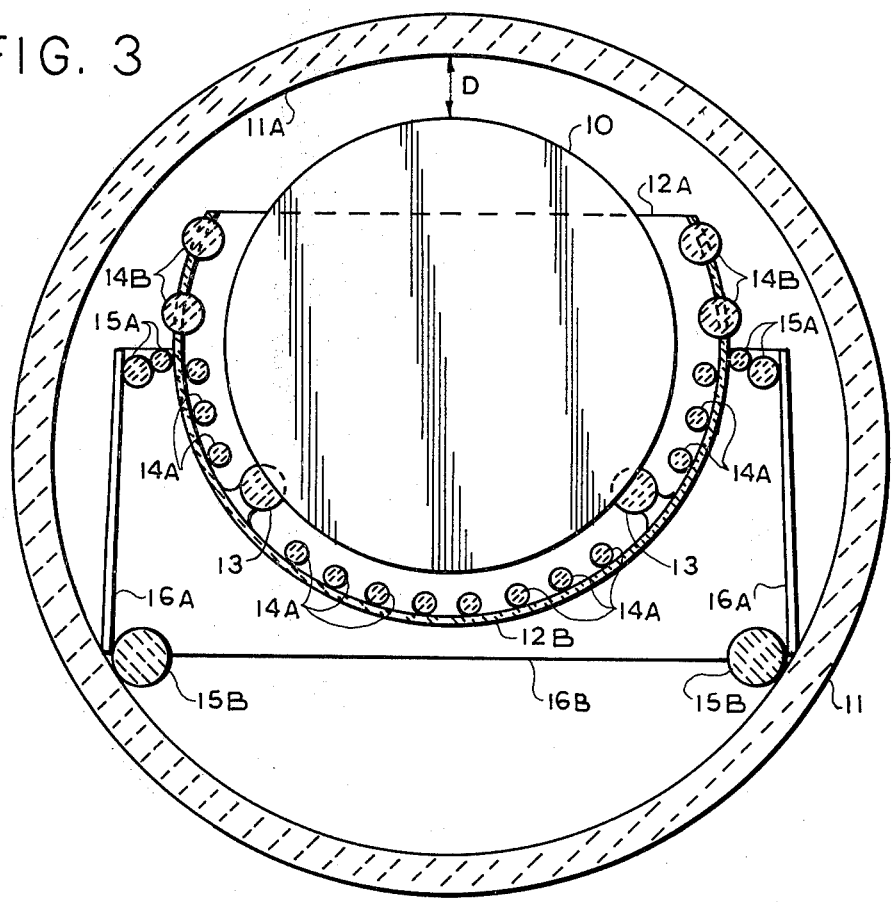
FIG. 3 is a cross-sectional view illustrating the wafer boat and its relation to the chamber of the present invention.

As has been indicated above, the present invention is adapted to provide more uniform flow of reactant gases and therefore more uniform deposition in a low pressure chemical vapor deposition system. This is accomplished by means which control the entrance and exit of the reactant gases into and from the system, as well as in the structure which controls the flow of gases within the system. In this manner, the flow of reactant gases is controlled so as to reduce the laminar molecular transport areas across a wafer in favor of more efficient turbulent transport. Such structure is designed to maintain a relatively uniform conductance of the gases between their source and their exit and to minimize the pressure difference across surfaces of the respective wafers.

The entrance and exit system of the present invention and, more particularly, the entrance system on the present invention employs one or more plenums which run the length of the deposition chamber below or to one side of the structure which the wafers are mounted. Furthermore, such plenums are provided with slots or openings designed to inject the reactant gases in a uniform manner along the length of such plenums. This overcomes the problems of the prior art wherein, with uniform openings along the pipe or plenum, more of the gases will be released at the entrance to the plenum than at more distant portions of the plenum. Similarly, if gases are introduced from both ends of the plenum, more gases will be released close to the entrances of the plenum rather than in the middle of the plenum.

In addition, the wafer support or boat is designed to break up concentrations of the reactant gases and reduce or prevent non-uniform mass transport from those gases due to the pressure difference across the surfaces of the wafers. One of the problems overcome by the present invention is the reduction of the turbulent boundary layer (vena contracta area) which forms on wafers at the entrance to the spaces between the wafers as the reactant gases are injected therebetween. That is to say, a thin layer is set up adjacent to the surface of a wafer which layer contains gas species decreasing in directed velocity to a zero value at the surface. The reactant gases must diffuse across this boundary layer in order to come in contact with the surfaces of the wafers. The boundary layer is a function of the spacing between the wafers, the distance along the wafers, the gas pressure, viscosity, gas velocity, and so forth. To this end, the wafer support or boat is encaged by a plurality of rods running transverse to the respective wafers and parallel to the axis of the deposition chamber. With the proper spacing of these rods, not only are the reactant gases diffused so as to decrease pressure differences along the flow, but the above-described boundary layer is also made more uniform across the wafer.

The features of the present invention are illustrated generally in FIG. 1. As shown therein, wafer support or boat 12 includes two wafer support rods and a plurality of diffusing rods 14 which encage wafers 10, at least from the direction in which the reactant gases are injected. Boat 12 is attached to and rests upon a baffle 15 which is formed of four quartz plates so as to direct the reactant gases upwardly from the plenums 17 from which the gases are injected. This entire structure then rests within deposition chamber 11.

Referring again to FIG. 1, the reactant gases are injected into chamber 11 in a direction away from the respective wafers 10 so that they are mixed and then forced upwardly between the wafers by baffle 15. As reactant gases enter between respective wafers 10, they are further diffused by diffusing rods 14 to obtain a more uniform transport of mass across the surfaces of wafers. While a relatively low conductance path is desired across the surfaces of the wafers, the exit path from the chamber should have a relatively high conductance path after the reactant gases have crossed the wafers. To this end the dimension D between wafers 10 and the confining surface of the chamber is an important factor in maintaining a low conductance to the exhaust part of the chamber at the tops of wafers. It will be noted in FIG. 1 that at least two plenums are employed to prevent reaction of the reactant gases for gases which may react in the gas phase prior to their contact with the surfaces of the wafers.

DETAILED DESCRIPTION OF THE INVENTION

Plan views of different types of plenums are illustrated in FIGS. 2A–C. While such plenums run the length of the active portions of the deposition chamber under the wafer support or boat, such plenums do not run the length of the entire chamber. The reactant gases are supplied to the respective plenums, from one end or both ends, by conduits (not shown) that enter from the side of the chamber. Such conduits can have a rather loose fit with the respective plenums without noticeably affecting the conductance of the gas flow. By making the plenum assembly in a multipiece manner, breakage is reduced during assembly, which breakage is due to the fragility of the plenums and their respective conduits which are made out of quartz. It will be understood that plenums, the wafer support or boat, and the chamber itself are all made out of quartz.

The plenum of FIG. 2A is a type of plenum that would be employed when the reactant gas is entered into both sides of the plenum. In this embodiment, plenum 17A can receive the reactant gas from both of entrance ports 18A which are connected to conduits not shown, as was described above. For an even distribution of the reactant gas under the wafers, slot 19A is provided which is in the shape of a double wedge or diamond where the width of the slot will vary from a zero width at either end to a width whose dimension is a function of gas flow and pumping capacity. This dimension is relative to the other dimensions of the chamber as will be more thoroughly discussed below. This type of plenum is particularly adapted for the use of Silane gas. When the system is to be employed for lesser numbers of wafers in smaller systems designed for easier maintenance and less critical uniformity requirements, the proper slot is illustrated in FIG. 2B wherein the reactant gas is entered into only one end of plenum 17B. In this embodiment, the proper slot is a wedge shape running the length of the wafers, which wedge varies in width from zero mils to a dimension depending on gas flow and pumping capacity, the other dimensions of the chamber being the same as discussed above.

In another situation, it might be desirable to have slight restrictions along the length of the slot. In the embodiment of FIG. 2B, it might be desireable to restrict the gas flow from the slot at the beginning of the plenum, and this can be done by fusing a short rod such as a 2 mil rod over the slot. This provides an extra degree of fine tuning to the slot design. In addition, a straight slot, much less costly to fabricate than a wedge, can be employed as illustrated in FIG. 2C where the slot 19C is fine-tuned by the placement of short rods 20. FIGS. 2B and 2C represent developmental systems where a wide variety of gas flow may be "tuned-in".

In general, it has been found that for the dimensions of the chamber under consideration, the uniform depositing can be achieved with a wedge type slot opening up to 10 mils over a distance of about 14 inches. Another consideration in the design of the slot depends upon whether the gases are exhausted from the chamber at both ends or only from one end. Furthermore, with three piece plenum as discussed above, where the gases are entered into the plenum from both ends, the plenum can be rotated to change the angle of attack as the gases come out of the plenum.

Figure 4:
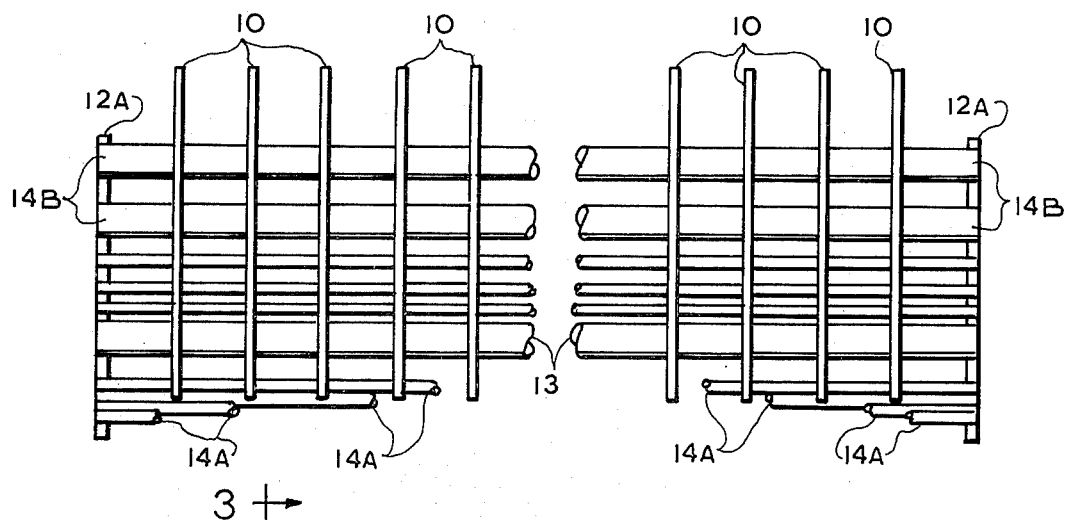
FIG. 4 is a cross-sectional side view of the structure of FIG. 3.

A more detailed view of the wafer support or boat is illustrated in FIG. 3. As was indicated above, a function of the boat is not only to support the wafers but also to channel the reactant gases between and around the respective wafers in a more diffused and uniform manner so as to achieve more uniform deposition and growth on the wafer surfaces. As illustrated in FIG. 3, a plurality of wafers 10 are supported by support rods 13 which are part of the wafer support boat that also includes a plurality of diffusing rods 14A and 14B which are suspended between end plates 12A. All of the structures discussed herein are formed of quartz. This boat arrangement rests in a cradle formed by plurality of curved straps 12B that are spaced along the boat and which are in turn attached to a baffle arrangement of side plates 16A by way of support rods 15A. The baffle is completed by end plates 16B with the baffle being completed by support rods 15B so that the entire structure may be slipped inside of deposition chamber 11. A side view of the wafer support or boat of FIG. 3 is illustrated in FIG. 4.

As was indicated above, particular dimensions are critical with regard to the size of the chamber in order to maintain the proper gas flow conductance as reactant gases are forced in between the wafers by the baffle arrangement and a higher gas flow conductance as the reactant gases are exhausted from the chamber once they have crossed over the surfaces of the respective wafers.

In the embodiment of the present invention as described above, the deposition chamber is 135 millimeters in diameter while the diameter on silicon wafers is 3 inches. Furthermore, the chamber is employed as a low pressure deposition chamber and in the embodiment of the present invention the pressure in the chamber would be between approximately 100 millitorr and 20 torr while the pressure of the reactant gases in the respective plenums would be between 1500 millitorr and 100 torr. Therefore, without the gas diffusing geometry, there would be a large pressure difference across the surfaces of the wafers and a resultant high velocity of the reactant gases with a non-uniform boundary layer. In the present embodiment, it has been found that diffusing rods 14A should be spaced approximately 3 to 6 millimeters apart in order to provide the most uniform diffusion of the gases as they cross the above-described boundary layer and enter in between the respective wafers. In the embodiment as described, the wafers are spaced between 3/16 and ⅜ of an inch, although the spacing of the wafers can be increased or decreased. A good uniformity of deposition with a high deposition rate can be achieved with ⅜ inch spacing between the wafers.

The other important dimension, in order to achieve proper gas flow conductance, is the spacing of the top of the wafers from the adjacent confining surface of the chamber. This is indicated in FIG. 3 as dimension D. This dimension should be between 3 and 10 millimeters. If this dimension is increased much above 10 millimeters the conductance path will not prevent the gases from again entering between the wafers for additional unwanted reaction on the wafer surfaces. Rods 14B prevent gases traveling to the exhaust from re-entering the wafer areas. The positioning of the boat in the deposition chamber is such that the top of the chamber, spaced at dimension D from a wafer, acts as an extension of the boat, providing a decreased conductance path above the wafers as if rods 14B were physically spaced around the tops of the wafers.

The structure described above is adapted to provide optimum conductance paths for the flow of the reactant gases such that, once they have traversed the surfaces of the wafers, they will not re-enter between the wafers and disturb the uniformity of the respective depositions. Thus, as illustrated in FIGS. 1 and 3, the reactant gases are injected into the chamber from beneath the wafers so that they will be drawn across the surfaces of the wafers and then dispersed to the sides of the wafer boat or support where they are isolated from the wafers by the same baffle arrangement 15 that directs the flow of the gases across the surfaces of the wafers. In this manner, an optimum gas flow and resulting uniformity is achieved.

The structure described is adapted particularly for a low pressure chemical vapor deposition system wherein interaction between the reactant gases is eliminated before they make contact with the surfaces of the wafers. Since carrier gases are not required in such a system, uniformity of the deposition is much more easily controlled. With the system described, more heavily doped polysilicon and epitaxial silicon depositions can be achieved without decreasing the uniformity of the depositions across the surfaces of the wafers. Such a system is also particularly adapted for the growth of low temperature oxides such as silicon dioxide.

EPILOGUE

A structure for a low pressure chemical vapor deposition system has been disclosed which structure achieves greater uniformity of deposition. The structure includes injection means designed to provide more uniform distribution of the reactant gases injected into the system, as well as means to control the gas flow across the surfaces of the respective wafers and then the exhaust of those gases from the system. To this end, the plenums which run the length of the deposition chamber beneath or to the side of the wafers are provided with openings arranged in a non-uniform manner to achieve this uniform injection. Furthermore, the wafer support or boat is provided with means to disperse concentrations of the reactant gases so as to provide more uniformity of the gas flow across the surfaces of the wafers. In addition, the structure provides for optimum exhaust of the reactant gases once they have crossed the surfaces.

While but one embodiment of the present invention have been disclosed, it will be obvious to those skilled in the art that variations and modifications may be made therein without departing from the spirit of the scope of the invention as claimed.

What is claimed is:

1. In a low pressure chemical vapor deposition system having a chamber, said chamber having an axis, the structure comprising;
   a wafer support structure to support a crystalline wafer, said structure being mounted in said chamber parallel to said axis; and
   a plenum mounted in said chamber parallel to said axis and to one side of said wafer support structure, said plenum being provided with aperture means for injecting a reactant gas into said chamber to provide a uniform distribution of said gas along the axis of said chamber;
   said wafer support structure including a plurality of rods mounted parallel to said axis and surrounding at least a portion of said wafer so as to disperse the reactant gas as it flows across the wafer surface.

2. A structure according to claim 1 further including:
   a second plenum mounted in said chamber parallel to said axis and to one side of said wafer support structure and provided with aperture means for injecting a second reactant gas into said chamber.

3. A structure according to claim 1 further including:
   means to provide said reactant gas to said plenum from one end thereof;
   said aperture means including a wedge shaped slot beginning at a zero width toward the end where the gas is entered and uniformly increasing to a maximum width toward the other end.

4. A structure according to claim 1 further including:
means to enter said reactant gas into said plenum from both ends thereof;
said aperture means including a double wedge shaped slot beginning at zero width at each end and uniformly increasing to a maximum width in the center thereof.

5. A structure according to claim 1 wherein:
the gas pressure in said chamber is between approximately 100 millitorr and 20 torr and the pressure of the reactant gas in plenum is between 1500 millitorr and 100 torr.

6. A structure according to claim 5 wherein:
said wafer support structure supports said wafer with the wafer edge opposite said plenum between 3 and 10 mils from said chamber surface.

7. A structure according to claim 5 wherein:
said parallel rods are spaced approximately 3 to 6 millimeters apart.

8. In a low pressure chemical vapor deposition system, the structure comprising:
a chamber having an axis; and
a plenum mounted in said chamber parallel to said axis and to one side of said chamber said plenum being provided with aperture means for injecting a reactant gas at subatmospheric pressure into said chamber to provide a uniform distribution of said gas along the axis of said chamber.

9. A structure according to claim 8 further including:
means to provide said reactant gas to said plenum from one end thereof;
said aperture means including a wedge shaped slot beginning at the zero width toward the end where the gas is entered into said plenum and uniformly increasing to a maximum width toward the other end.

10. A structure according to claim 8 further including:
means to enter said reactant gas into said plenum from both ends thereof;
said aperture means including a double wedge shaped slot beginning at zero width toward each end and uniformly increasing in width to a maximum width in the center thereof.

11. In a low pressure chemical vapor deposition system, having a chamber, said chamber having an axis, the structure comprising:
a wafer support structure to support a crystalline wafer, said structure being mounted in said chamber parallel to said axis; and
a plenum mounted in said chamber parallel to said axis and to one side of said wafer support structure to inject a reactant gas into said chamber;
said wafer support structure including a plurality of rods mounted parallel to said axis and surrounding at least a portion of said wafer so as to disperse the reactant gas as it flows across the wafer surface.

12. A structure according to claim 11 wherein:
said wafer support structure supports said wafer with the wafer edge opposite said plenum between 3 and 10 mils from said chamber surface.

* * * * *